(12) United States Patent  
Tauscher et al.

(10) Patent No.: US 8,218,218 B2
(45) Date of Patent: Jul. 10, 2012

(54) FATIGUE RESISTANT MEMS APPARATUS AND SYSTEM

(75) Inventors: Jason B. Tauscher, Sammamish, WA (US); Matthew Ellis, Austin, TX (US); Dean R. Brown, Lynnwood, WA (US); Mark P. Helsel, Seattle, WA (US); Wyatt O. Davis, Bothell, WA (US); Yunfei Ma, Redmond, WA (US); Michael E. Sherwood, Seattle, WA (US); John Wyatt Coy, Redmond, WA (US); David Malametz, Carnation, WA (US)

(73) Assignee: Microvision, Inc., Redmond, WA (US)

( * ) Notice: Subject to any disclaimer, the term of this patent is extended or adjusted under 35 U.S.C. 154(b) by 592 days.

(21) Appl. No.: 12/420,426

(22) Filed: Apr. 8, 2009

(65) Prior Publication Data

US 2010/0259806 A1    Oct. 14, 2010

(51) Int. Cl.
*G02B 26/08* (2006.01)

(52) U.S. Cl. ...................................... 359/224.1

(58) Field of Classification Search .... 359/198.1–199.4, 359/200.6–200.8, 221.2, 223.1–224.1
See application file for complete search history.

(56) References Cited

U.S. PATENT DOCUMENTS

| | | | | |
|---|---|---|---|---|
| 5,629,790 | A | * | 5/1997 | Neukermans et al. ...... 359/198.1 |
| 5,969,465 | A | * | 10/1999 | Neukermans et al. ........ 310/333 |
| 6,547,145 | B2 | * | 4/2003 | Colley et al. ............. 235/462.36 |
| 6,775,043 | B1 | * | 8/2004 | Leung et al. ............... 359/200.8 |
| 8,130,436 | B2 | * | 3/2012 | Borchers ................... 359/224.1 |
| 2009/0185253 | A1 | * | 7/2009 | Tani et al. .................. 359/221.2 |
| 2009/0225387 | A1 | * | 9/2009 | Mizuno et al. ............. 359/221.2 |
| 2011/0228370 | A1 | * | 9/2011 | Tsai et al. .................. 359/221.2 |

* cited by examiner

*Primary Examiner* — Frank Font
(74) *Attorney, Agent, or Firm* — Kevin D. Wills

(57) ABSTRACT

A microelectromechanical system (MEMS) includes a conductor with improved reliability. The conductor flexes with a moving member in the MEMS device, and the improved reliability is achieved through material selections that provides increased fatigue resistance, reduced crack propagation, and/or mechanisms for improved live at a given strain level. The conductor may include a single material, or may include layers of different materials.

9 Claims, 7 Drawing Sheets

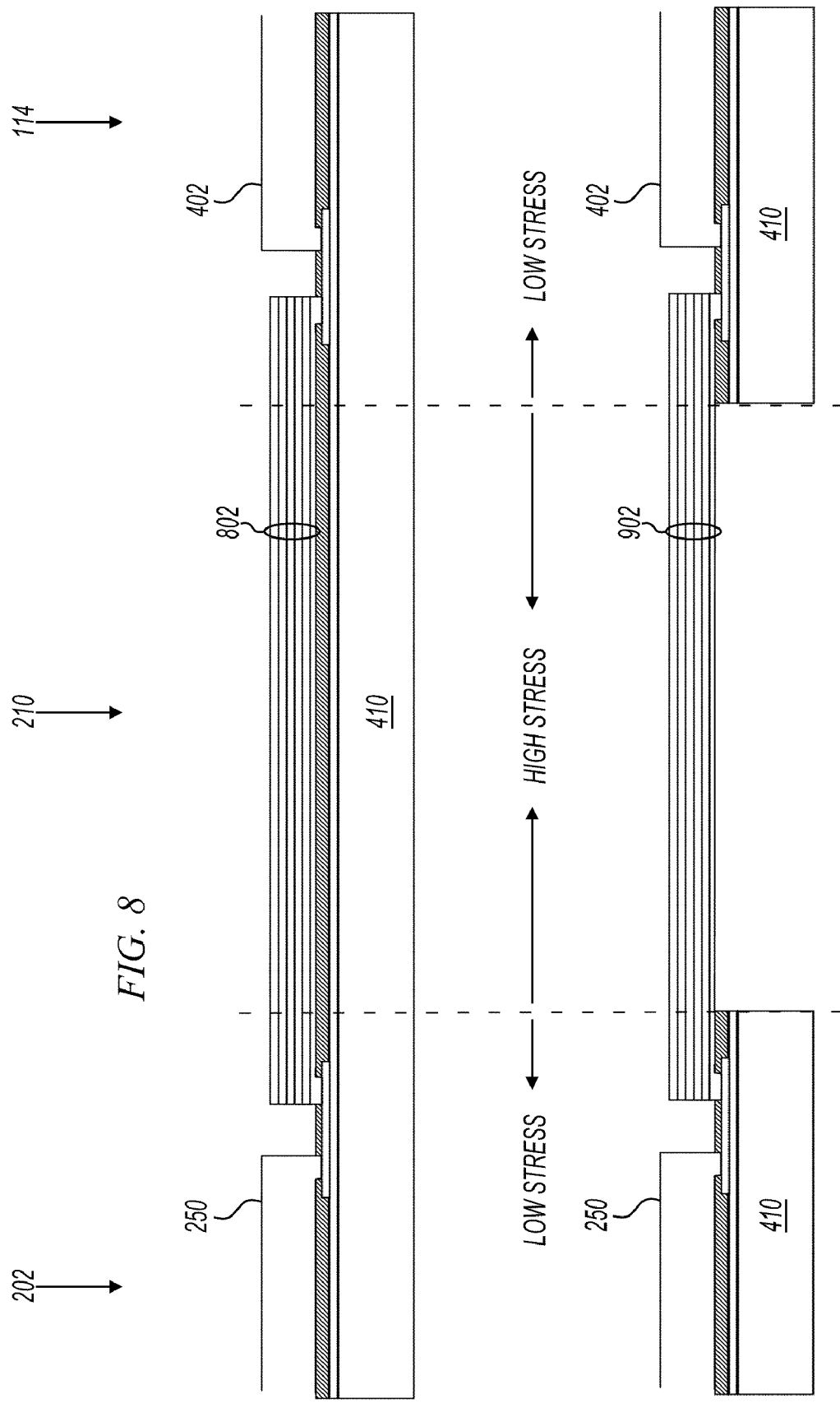

FATIGUE RESISTANT MEMS APPARATUS AND SYSTEM

FIELD

The present invention relates generally to microelectromechanical systems (MEMS), and more specifically to fatigue resistance in MEMS systems.

BACKGROUND

MEMS devices typically have moving parts. The moving parts may bend, twist, or otherwise undergo cyclic mechanical and/or thermal stress. Some MEMS devices have metal on the moving parts. For example, a current carrying conductor may be formed from a metallic trace such as copper. Metal fatigue from repeated motion may cause cracks to form in the metal, resulting in undesirable changes in resistance or an open circuit which can cause the electrical circuit to fail.

BRIEF DESCRIPTION OF THE DRAWINGS

FIGS. 6-9 show laminate stacks of materials used in a MEMS device;

DESCRIPTION OF EMBODIMENTS

Figure 1:
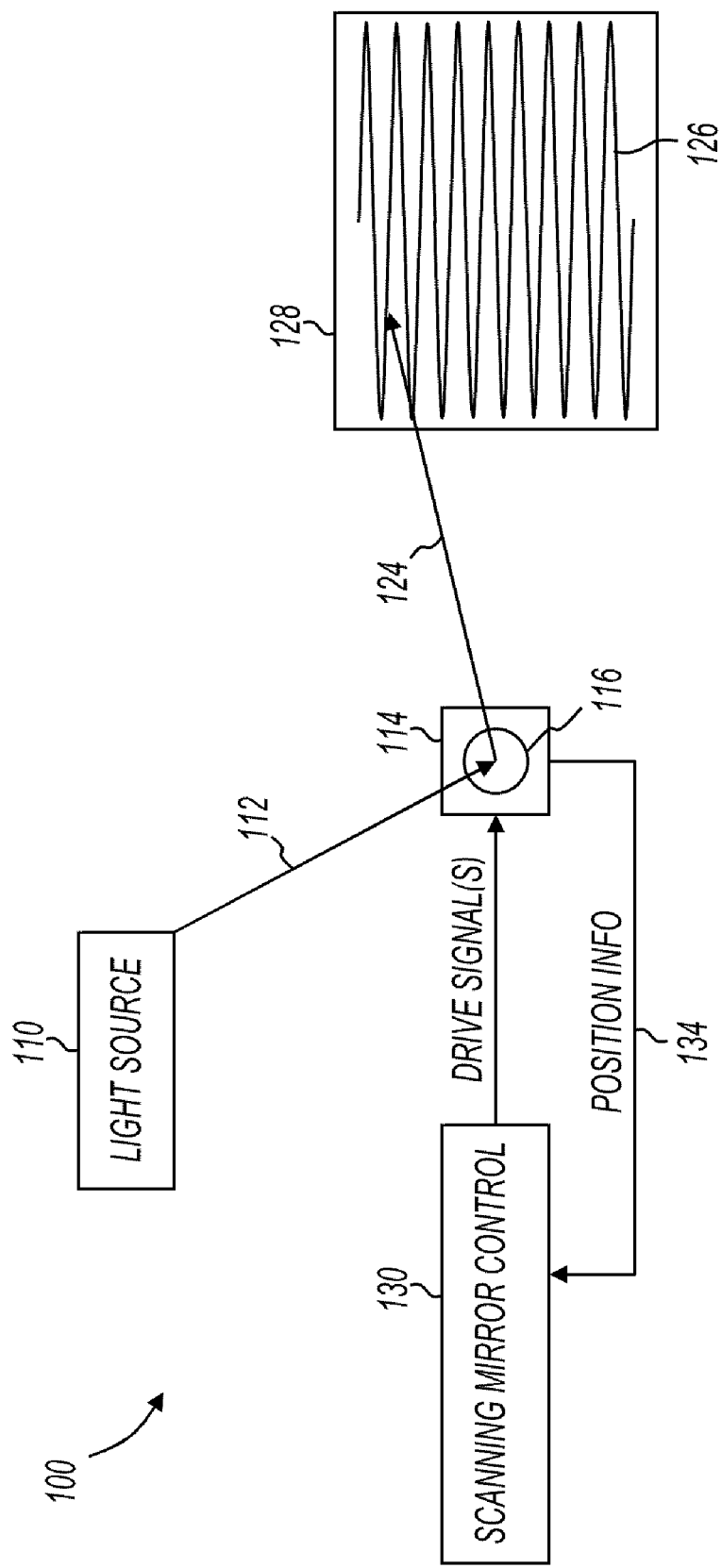
FIG. 1 shows a block diagram of a scanned beam projection system in accordance with various embodiments of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a scanned beam projection system in accordance with various embodiments of the present invention. As shown in FIG. 1, scanned beam projection system 100 includes a light source 110, which may be a laser light source such as a laser diode or the like, capable of emitting a beam 112 which may be a laser beam. The beam 112 impinges on a scanning platform 114 which is part of a microelectromechanical system (MEMS) based scanner or the like, and reflects off of scanning mirror 116 to generate a controlled output beam 124. A scanning mirror control circuit 130 provides one or more drive signal(s) to control the angular motion of scanning mirror 116 to cause output beam 124 to generate a raster scan 126 on a projection surface 128.

In some embodiments, raster scan 126 is formed by combining a sinusoidal component on the horizontal axis and a sawtooth component on the vertical axis. In these embodiments, controlled output beam 124 sweeps back and forth left-to-right in a sinusoidal pattern, and sweeps vertically (top-to-bottom) in a sawtooth pattern with the display blanked during flyback (bottom-to-top). FIG. 1 shows the sinusoidal pattern as the beam sweeps vertically top-to-bottom, but does not show the flyback from bottom-to-top. In other embodiments, the vertical sweep is controlled with a triangular wave such that there is no flyback. In these embodiments, pixels may be painted in one vertical direction or in both vertical directions. In still further embodiments, the vertical sweep is sinusoidal. The various embodiments of the invention are not limited by the waveforms used to control the vertical and horizontal sweep or the resulting raster pattern.

Scanning platform 114 and scanning mirror 116 are deflected according to signals provided by scanning mirror control circuit 130, and mirror position information is provided back to scanning mirror control circuit 130 at 134. The mirror position information may describe angular position in the vertical direction, the horizontal direction, or both. Scanning mirror control circuit 130 receives the position information, determines the appropriate drive signals, and drives scanning platform 114.

Scanning platform 114 is supported by one or more moving members that bend or twist as scanning platform 114 moves to deflect the light beam. In some embodiments, the moving members have one or more conductors to carry current to circuits or coils on scanning platform 114. In some embodiments, a metal material such as gold or nickel is used to provide improved reliability. The mechanisms for improved reliability may include, but are not limited to, basic improved fatigue resistance of the material, or stress relaxation mechanisms that resist propagation of cracks leading to failure. As used herein, the term "fatigue resistance conductors" refers to any such mechanisms leading to increased life/reliability at a given operating strain level. Similarly, the terms "fatigue resistant" and "higher fatigue resistance" refer to material properties that resist crack propagation for a given operating strain level.

Further, in some embodiments, multiple layers of materials are used to create the conductor. The multiple layers may alternate between different conductive materials or may alternate between conductive materials and insulating materials. MEMS devices and fatigue resistant conductors are described further below with reference to later figures.

Figure 2:
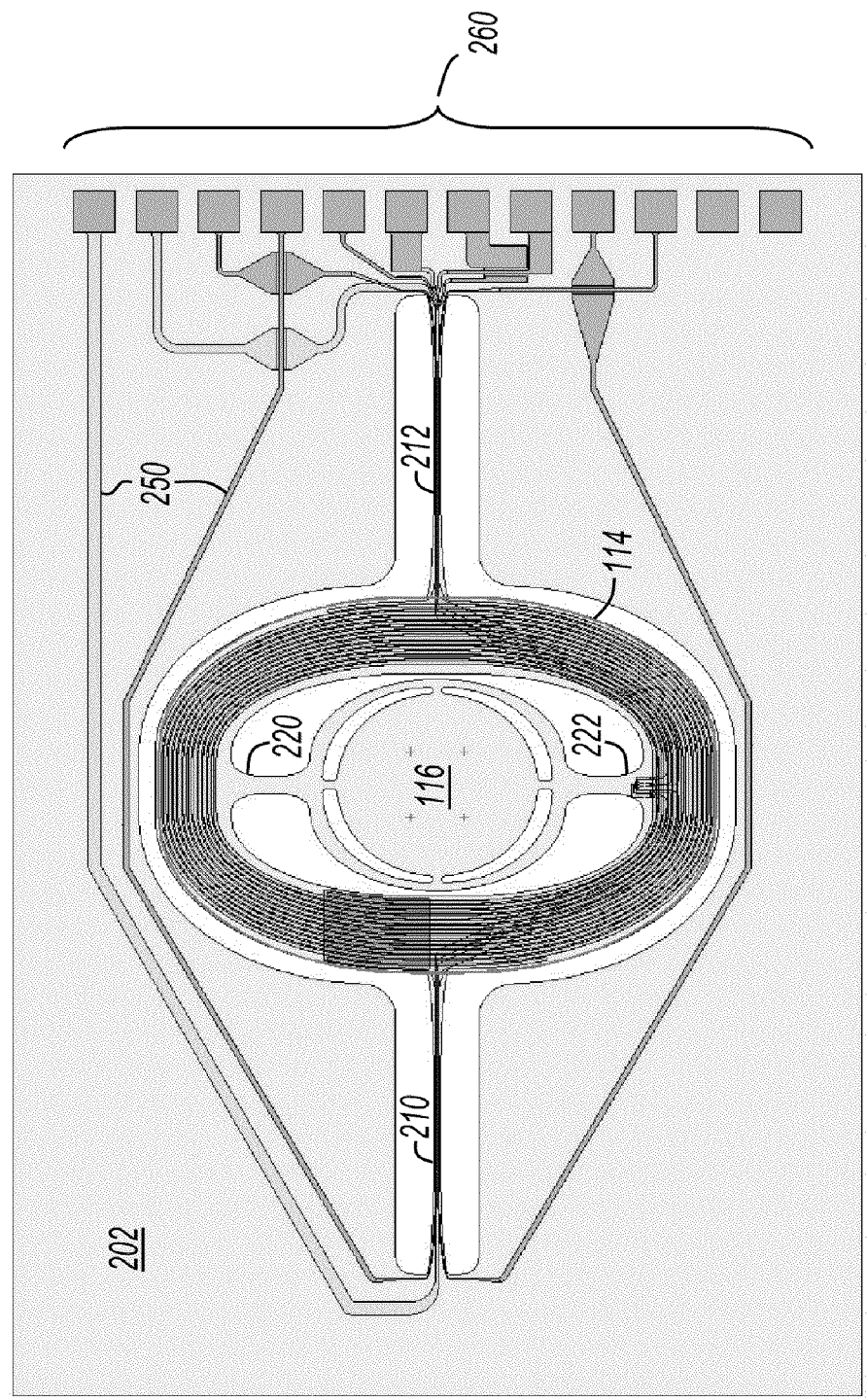
FIG. 2 shows a plan view of a microelectromechanical system (MEMS) device with a scanning platform and scanning mirror.

FIG. 2 shows a plan view of a microelectromechanical system (MEMS) device with a scanning platform and scanning mirror. MEMS device 200 includes fixed platform 202, scanning platform 114 and scanning mirror 116. Scanning platform 114 is coupled to fixed platform 202 by flexures 210 and 212, and scanning mirror 116 is coupled to scanning platform 114 by flexures 220 and 222. Scanning platform 114 has a drive coil connected to drive lines 250. Current driven into drive lines 250 produces a current in the drive coil. MEMS device 200 also incorporates one or more integrated piezoresistive position sensors. In some embodiments, MEMS device 200 includes one position sensor for each axis. Two of the interconnects 260 are coupled to drive lines 250. The remaining interconnects provide for the integrated position sensors for each axis.

In operation, an external magnetic field source (not shown) imposes a magnetic field on the drive coil. The magnetic field imposed on the drive coil by the external magnetic field source has a component in the plane of the coil, and is oriented non-orthogonally with respect to the two drive axes. The in-plane current in the coil windings interacts with the in-plane magnetic field to produce out-of-plane Lorentz forces on the conductors. Since the drive current forms a loop on scanning platform 114, the current reverses sign across the scan axes. This means the Lorentz forces also reverse sign across the scan axes, resulting in a torque in the plane of and normal to the magnetic field. This combined torque produces responses in the two scan directions depending on the frequency content of the torque.

Scanning platform 114 moves relative to fixed platform 202 in response to the torque. Flexures 210 and 220 are torsional members that twist as scanning platform 114 undergoes an angular displacement with respect to fixed platform 202. In some embodiments, scanning mirror 116 moves relative to scanning platform 114 at a resonant frequency, although this is not a limitation of the present invention.

The long axis of flexures 210 and 212 form a pivot axis. Flexures 210 and 212 are flexible members that undergo a torsional flexure, thereby allowing scanning platform 114 to rotate on the pivot axis and have an angular displacement relative to fixed platform 202. Flexures 210 and 212 are not limited to torsional embodiments as shown in FIG. 2. For example, in some embodiments, flexures 210 and 212 take on other shapes such as arcs, "S" shapes, or other serpentine shapes. The term "flexure" as used herein refers to any flexible member coupling a scanning platform to another platform (scanning or fixed), and capable of movement that allows the scanning platform to have an angular displacement with respect to the other platform.

Flexure 210 includes conductors coupled to drive lines 250 to carry current to the drive coil on platform 114. The drive coil may be made of one or more electrically conductive materials. For example, the drive coil may be made of copper, which is known to be an excellent electrical conductor. Also for example, in some embodiments, the drive coil contains more than one electrically conductive material (e.g., copper, nickel, gold) offering possible advantages of corrosion resistance and being wire bond compatible, in addition to having high electrical conductivity. Similarly, drive lines 250 on fixed platform 202 may also be copper conductors. While copper has very low electrical resistance, it does not have very low fatigue resistance. When subjected to repeated cyclic motion, as in the case of flexure 210, copper has a tendency to fatigue and crack.

Some embodiments of the present invention include a fatigue resistant material to form the conductor on flexure 210. The fatigue resistant material may have a higher electrical resistance, but the combination of higher fatigue resistance and higher electrical resistance is a trade-off that is made for reliability. In some embodiments, nickel is used as a higher fatigue resistant material. Nickel has both higher fatigue resistance and higher electrical resistance as compared to copper. Further, in some embodiments, tungsten may be used because of its higher fatigue resistance.

Some embodiments include one or more materials that have a stress relaxation mechanism that resist crack propagation. For example, the conductor on flexure 210 may include gold for improved reliability. Because of its stress relaxation qualities, gold (and similar materials) are referred to herein as fatigue resistant.

Some embodiments of the present invention utilize laminate structures to form the conductor on flexure 210. For example, in some embodiments, thin copper layers are interspersed with layers of a different material. If one thin layer of copper succumbs to fatigue and cracks, the layered structure stops the crack from propagating. The copper layers may be interspersed with another conductive layer or with an insulating layer. For example, some embodiments may intersperse thin layers of copper and nickel, copper and an insulator, nickel and an insulator, and the like.

Figure 3:
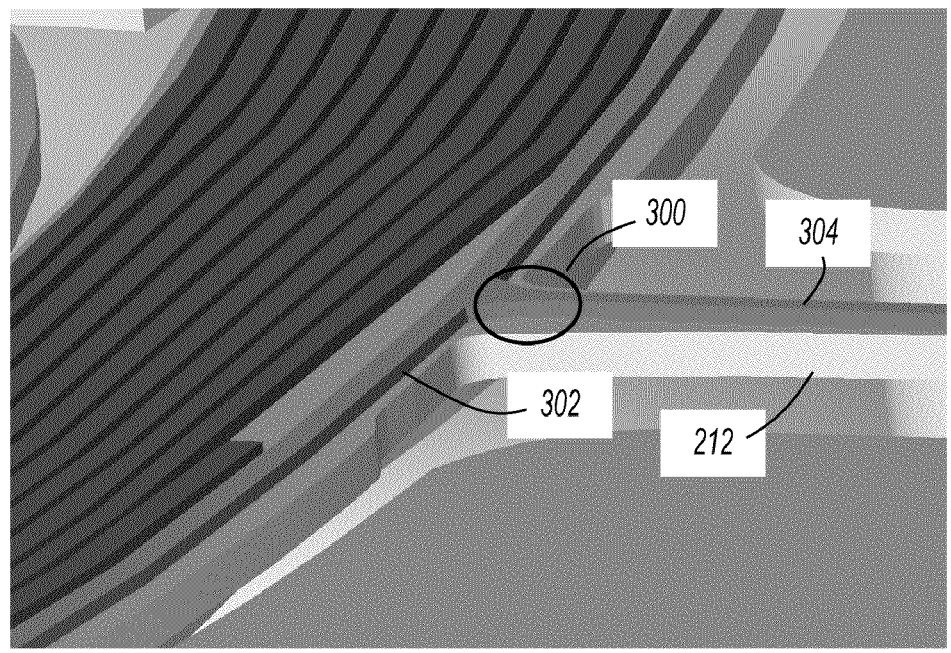
FIG. 3 shows a portion of the MEMS scanning mirror of FIG. 2 in greater detail.

FIG. 3 shows a portion of the MEMS scanning mirror of FIG. 2 in greater detail. Flexure 212 is shown having a conductor 304 that is coupled to the conductive coil 302 at 300. Windings in the conductive coil are shown generally in the upper left on scanning platform 114.

The windings in the conductive coil include a first conductive material having a low electrical resistance such as copper. Copper has excellent electrical properties (e.g., low resistance), but also has a relatively low fatigue resistance. Conductor 304 on flexure 212 includes a second conductive material having a higher fatigue resistance than the first conductive material. For example, conductor 304 may be made of nickel, which is known to have a higher fatigue resistance than copper. Nickel has a higher electrical resistance than copper, but a relatively short length of nickel is used as compared to the length of the copper winding. Conductor 304 may also be made of a laminate material that includes layers of different conductors or layers of conductors and insulators.

The fatigue strength of the MEMS device is improved enormously, while the total coil resistance variation is small because the portion of the coil in the unstressed region (e.g., on scanning platform 114) contributes most of the total resistance. The two-sectional metal coil has significant fatigue resistance improvement while the total coil resistance remains within the design specification.

Figure 4:
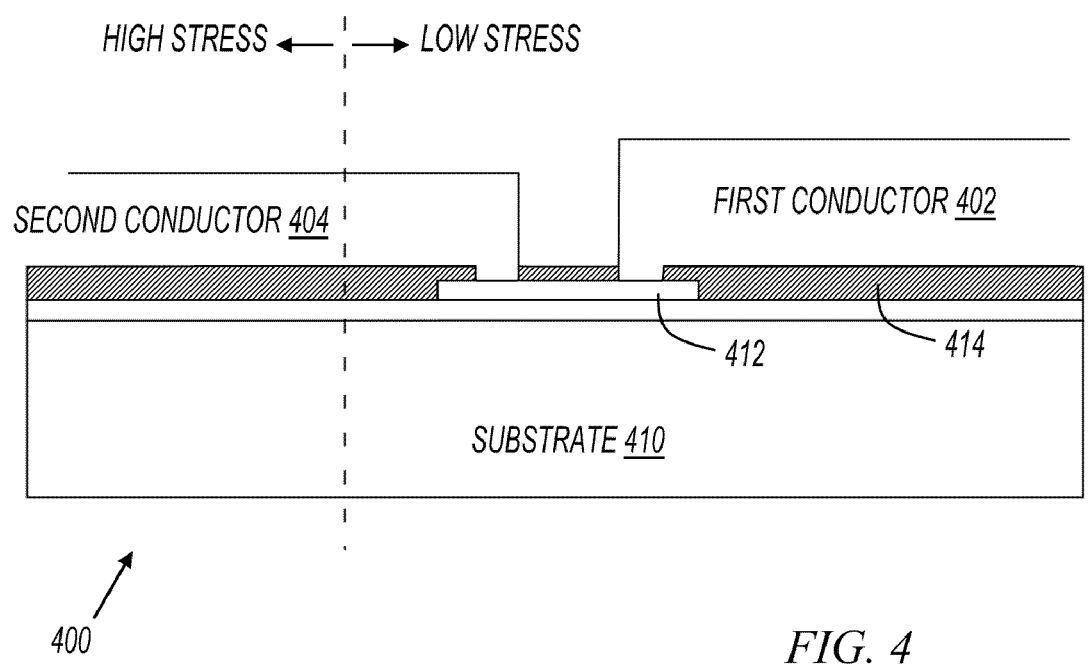
FIGS. 4 and 5 show dissimilar conductive materials used in a MEMS device.
Figure 5:
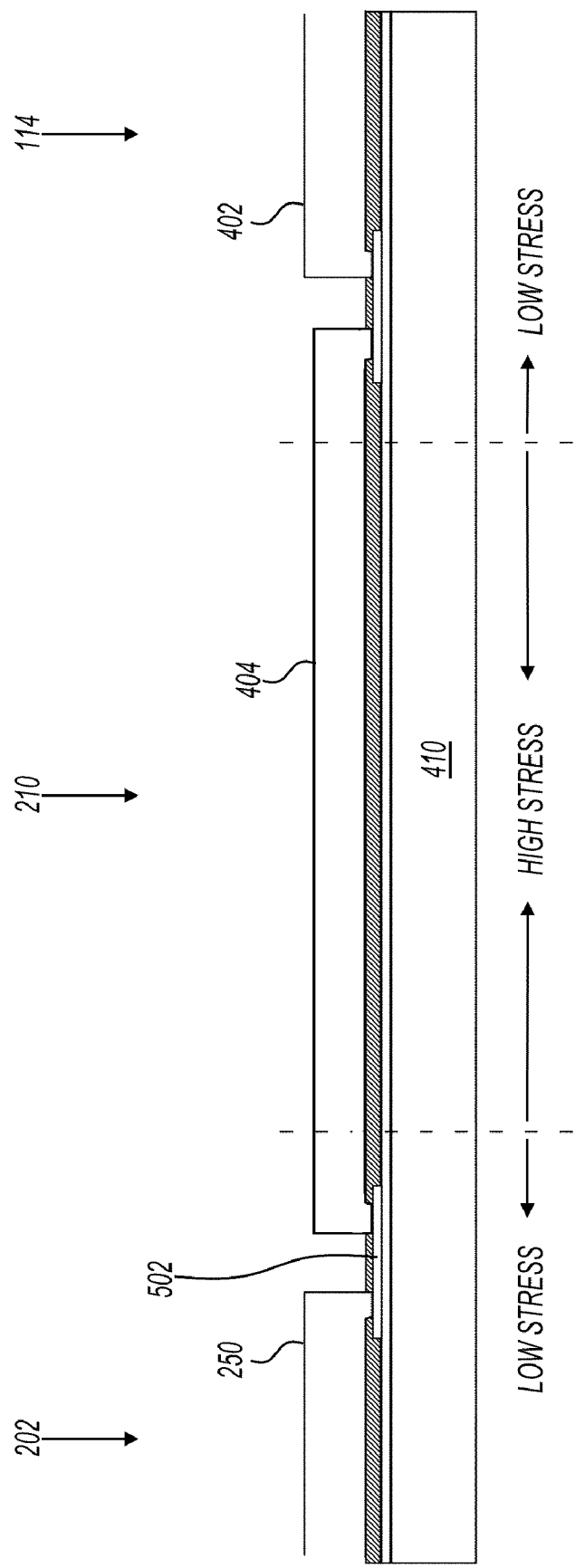

FIGS. 4 and 5 show dissimilar conductive materials used in a MEMS device. Cross section 400 represents an embodiment of the connection shown at 300 in FIG. 3. First conductor 402 corresponds to conductor 302 which is part of the coil on scanning platform 114, and second conductor 404 corresponds to conductor 304 on flexure 212. First conductor 402 and second conductor 404 are formed on insulator 414, which is in turn formed on substrate 410. Substrate 410 may be any suitable substrate upon which to build the indicated structures. For example, substrate 410 may be silicon. Underpass 412 is a conductive material formed on substrate 410, and is used to provide an electrical connection between the first and second conductors. Underpass 412 may be patterned from a first metal layer, whereas first conductor 402 and second conductor 404 may be formed on subsequent metal layers.

As shown in FIG. 4, second conductor 404 undergoes high mechanical and/or thermal stress, whereas first conductor 402 does not. According to various embodiments of the present invention, first conductor 402 includes a material with low electrical resistance such as copper, and second conductor 404 includes a material with a potentially higher electrical resistance but with a higher fatigue resistance such as tungsten, nickel, or gold. In some embodiments, conductor 402 includes more than one electrically conductive material (e.g., copper, nickel, gold) offering possible advantages of corrosion resistance and being wire bond compatible, in addition to having high electrical conductivity.

In FIG. 5, fixed platform 202 (see also FIG. 2) is shown generally on the left, flexure 210 is shown generally in the center, and scanning platform 114 is shown generally on the right. Conductor 404 on the flexure is coupled to conductor 402 on the scanning platform by an underpass as described above with reference to FIG. 4. As shown in FIG. 5, a similar connection may be made on the fixed platform. Fixed platform 202 includes conductor 250 coupled to conductor 404 by underpass 502. In some embodiments, conductors 250 and 402 are made from a low electrical resistance metal such as copper, whereas conductor 404 is made from a higher electrical resistance metal such as nickel, gold, or tungsten.

The various metal layers may be deposited using any suitable techniques. For example, in some embodiments, the various layers are deposited using chemical vapor deposition. In other embodiments, various metal layers are formed using electroplating techniques. The various embodiments of the invention are not limited to any specific manufacturing technique.

Figure 6:
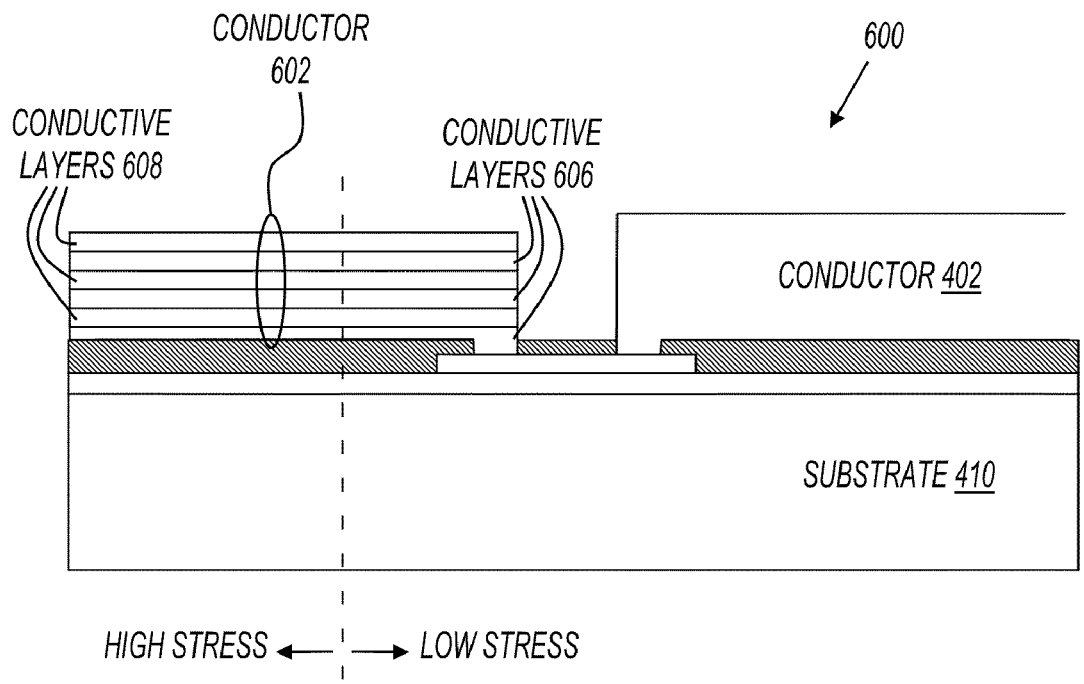

FIGS. 6-9 show laminate stacks of materials used in a MEMS device. As shown in FIG. 6, cross section 600 represents an embodiment of the connection shown at 300 in FIG. 3. First conductor 402 corresponds to conductor 302 which is part of the coil on scanning platform 114, and second conductor 602 corresponds to conductor 304 on flexure 212. As shown in FIG. 6, second conductor 602 undergoes high mechanical and/or thermal stress, whereas first conductor 402 does not.

According to various embodiments of the present invention, first conductor 402 is made from a material with low electrical resistance such as copper, and second conductor 404 is a laminate material that includes multiple layers of different conductive materials. In this way an effective conductor may be formed with overall enhanced performance in both reliability and resistivity when compared to any single material. For example, conductive layers 606 are of a first conductive material and conductive layers 608 are of a different conductive material. In some embodiments, conductive layers 606 are of a low electrical resistance, low fatigue resistance material such as copper, and conductive layers 608 are of a higher electrical resistance, higher fatigue resistance material such as nickel or tungsten. Any two different conductors may be used in conductor 602 without departing from the scope of the present invention.

Figure 7:
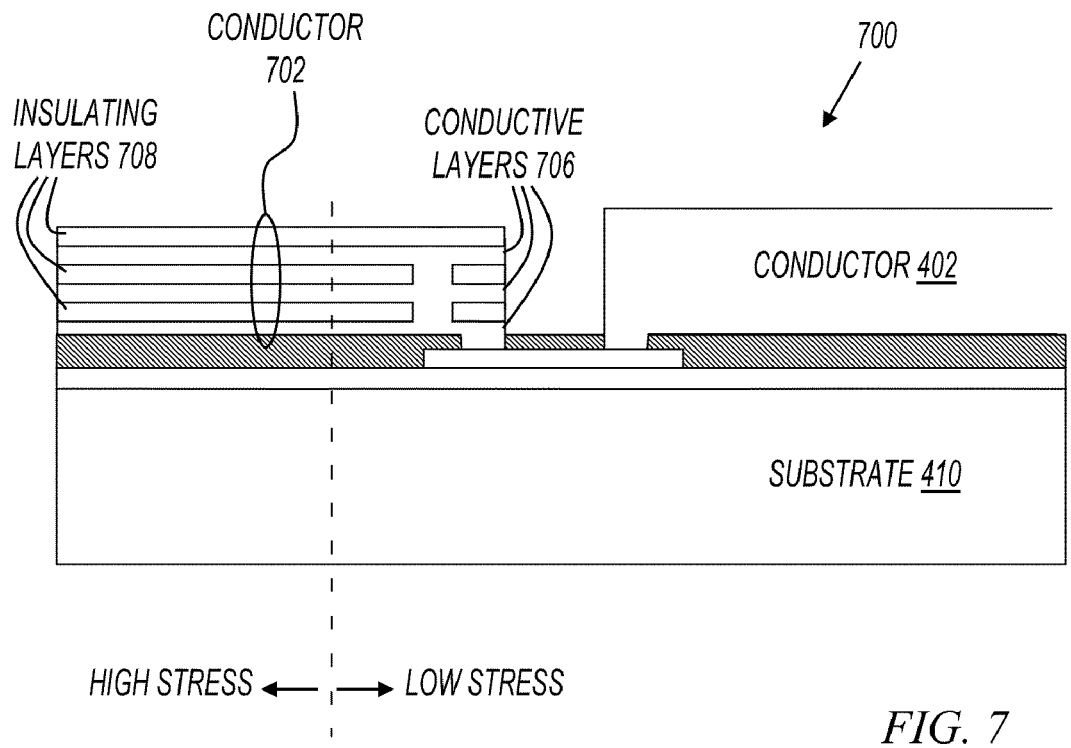

As shown in FIG. 7, cross section 700 represents an embodiment of the connection shown at 300 in FIG. 3. First conductor 402 corresponds to conductor 302 which is part of the coil on scanning platform 114, and second conductor 702 corresponds to conductor 304 on flexure 212. As shown in FIG. 7, second conductor 702 undergoes high mechanical and/or thermal stress, whereas first conductor 402 does not.

According to various embodiments of the present invention, second conductor 702 is a laminate material that includes multiple layers of conductive materials and insulating materials. For example, conductive layers 706 are of a first conductive material and insulating layers 708 are of an insulating material. In some embodiments, conductive layers 706 are of a low electrical resistance fatigue resistance material such as copper, and in other embodiments, conductive layers 706 are of a higher electrical resistance, higher fatigue resistance material such as nickel or tungsten. Any type of conductive materials and insulating materials may be used in conductor 702 without departing from the scope of the present invention.

Thin laminate conductors such as those shown in FIGS. 6 and 7 have greater fatigue strength and reliability than single large conductors such as conductor 402. If a single conductive layer should fatigue and crack, the crack is less likely to propagate across a layer boundary, thereby increasing liability. In embodiments with interspersed conductive layers (FIG. 6), if one conductive layer should crack, an adjacent conductive layer can provide a circuit path for current to flow around the cracked conductor. In embodiments with interspersed conductive layers and insulating layers, if one conductive layer should crack, other conductive layers can provide a circuit path for current to flow.

In FIGS. 8 and 9, fixed platform 202 (see also FIG. 2) is shown generally on the left, flexure 210 is shown generally in the center, and scanning platform 114 is shown generally on the right. FIG. 8 includes laminate conductor 802, which may include interspersed conductive layers (602, FIG. 6), interspersed conductive layers and insulating layers (702, FIG. 7), or any combination.

The difference between FIG. 8 and FIG. 9 is the structure of flexure 210. In FIG. 8, flexure 210 includes substrate 410 and conductor 802. In FIG. 9, flexure 210 has had the substrate 410 etched away. In embodiments represented by FIG. 9, the laminate conductor also performs the mechanical flexure function.

In some embodiments, the laminate structure of 902 performs a mechanical function without performing an electrical function. For example, a flexure may be formed from a laminate structure in accordance with embodiments of the invention. The thin laminate layers may or may not be conductive, and may be made from any suitable material. As an example, flexures 220 and 222 (FIG. 2) may be formed from the structure shown in FIG. 9.

Figure 10:
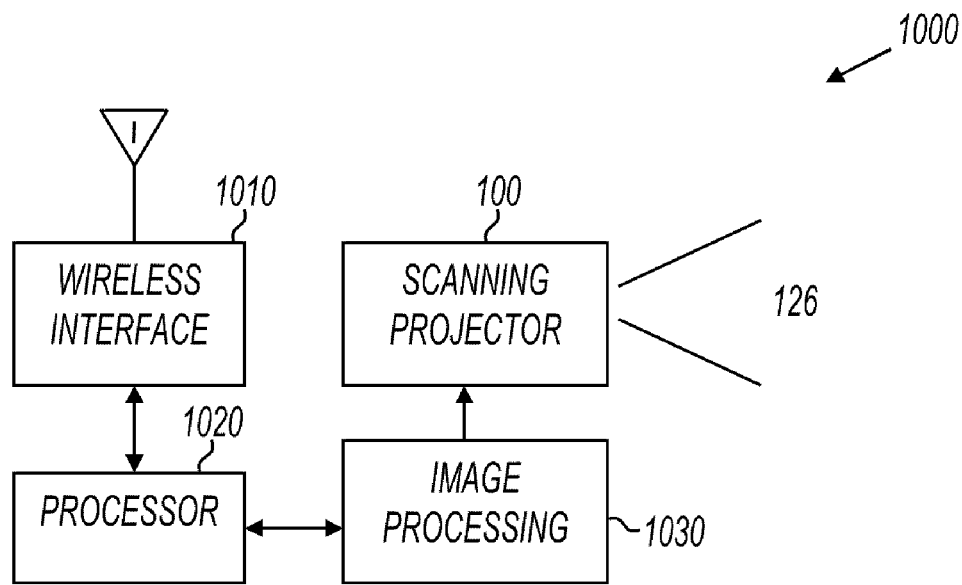
FIG. 10 shows a block diagram of a mobile device in accordance with various embodiments of the present invention.

FIG. 10 shows a block diagram of a mobile device in accordance with various embodiments of the present invention. As shown in FIG. 10, mobile device 1000 includes wireless interface 1010, processor 1020, image processing 1030, and scanning projector 100. Scanning projector paints a raster image at 126. Scanning projector 100 is described with reference to FIG. 1. In some embodiments, scanning projector 100 includes a MEMS device having fatigue resistant components. For example, in some embodiments, a fatigue resistant metal material such as gold or nickel is used. Also for example, in some embodiments, multiple layers of materials are used to create fatigue resistant members. The multiple layers may alternate between different conductive materials or may alternate between conductive materials and insulating materials.

Image processing 1030 may be any image source. For example, in some embodiments, image processing 1030 includes memory that holds still images. In other embodiments, image processing 1030 includes memory that includes video images. In still further embodiments, image processing 1030 processes imagery received from external sources such as connectors, wireless interface 1010, or the like. Image processing 1030 may also include processing circuitry and software to determine when to modulate light sources within scanning projector 100.

Wireless interface 1010 may include any wireless transmission and/or reception capabilities. For example, in some embodiments, wireless interface 1010 includes a network interface card (NIC) capable of communicating over a wireless network. Also for example, in some embodiments, wireless interface 1010 may include cellular telephone capabilities. In still further embodiments, wireless interface 1010 may include a global positioning system (GPS) receiver. One skilled in the art will understand that wireless interface 1010 may include any type of wireless communications capability without departing from the scope of the present invention.

Processor 1020 may be any type of processor capable of communicating with the various components in mobile device 1000. For example, processor 1020 may be an embedded processor available from application specific integrated circuit (ASIC) vendors, or may be a commercially available microprocessor. In some embodiments, processor 1020 provides image or video data to image processing 1030. The image or video data may be retrieved from wireless interface 1010 or may be derived from data retrieved from wireless interface 1010. For example, through processor 1020 and image processing 1030, scanning projector 100 may display images or video received directly from wireless interface 1010. Also for example, processor 1020 may provide overlays to add to images and/or video received from wireless interface 1010, or may alter stored imagery based on data received from wireless interface 1010 (e.g., modifying a map display in GPS embodiments in which wireless interface 1010 provides location coordinates).

Figure 11:
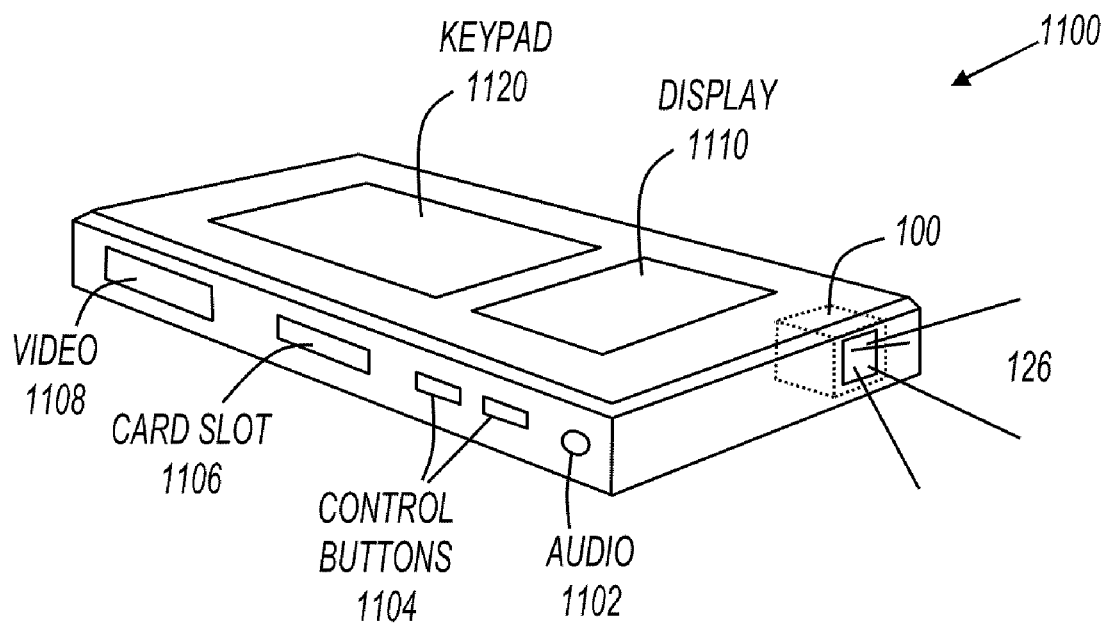
FIG. 11 shows a mobile device in accordance with various embodiments of the present invention.

FIG. 11 shows a mobile device in accordance with various embodiments of the present invention. Mobile device 1100 may be a hand held projection device with or without communications ability. For example, in some embodiments, mobile device 1100 may be a handheld projector with little or no other capabilities. Also for example, in some embodiments, mobile device 1100 may be a device usable for communications, including for example, a cellular phone, a smart phone, a personal digital assistant (PDA), a global positioning system (GPS) receiver, or the like. Further, mobile device 1100 may be connected to a larger network via a wireless (e.g., WiMax) or cellular connection, or this device can accept data messages or video content via an unregulated spectrum (e.g., WiFi) connection.

Mobile device 1100 includes scanning projector 100 to create an image with light at 126. Mobile device 1100 also includes image processing (FIG. 10) and other circuitry; however, they are intentionally omitted from FIG. 11 for clarity.

Mobile device 1100 includes display 1110, keypad 1120, audio port 1102, control buttons 1104, card slot 1106, and audio/video (A/V) port 1108. None of these elements are essential. For example, mobile device 1100 may only scanning projector 100 without any of display 1110, keypad 1120, audio port 1102, control buttons 1104, card slot 1106, or A/V port 1108. Some embodiments include a subset of these elements. For example, an accessory projector product may include scanning projector 100, control buttons 1104 and A/V port 1108.

Display 1110 may be any type of display. For example, in some embodiments, display 1110 includes a liquid crystal display (LCD) screen. Display 1110 may always display the same content projected at 126 or different content. For example, an accessory projector product may always display the same content, whereas a mobile phone embodiment may project one type of content at 126 while display different content on display 1110. Keypad 1120 may be a phone keypad or any other type of keypad.

A/V port 1108 accepts and/or transmits video and/or audio signals. For example, A/V port 1108 may be a digital port that accepts a cable suitable to carry digital audio and video data. Further, A/V port 1108 may include RCA jacks to accept composite inputs. Still further, A/V port 1108 may include a VGA connector to accept analog video signals. In some embodiments, mobile device 1100 may be tethered to an external signal source through A/V port 1108, and mobile device 1100 may project content accepted through A/V port 1108. In other embodiments, mobile device 1108 may be an originator of content, and A/V port 1108 is used to transmit content to a different device.

Audio port 1102 provides audio signals. For example, in some embodiments, mobile device 1100 is a media player that can store and play audio and video. In these embodiments, the video may be projected at 126 and the audio may be output at audio port 1102. In other embodiments, mobile device 1100 may be an accessory projector that receives audio and video at A/V port 1108. In these embodiments, mobile device 1100 may project the video content at 126, and output the audio content at audio port 1102.

Mobile device 1100 also includes card slot 1106. In some embodiments, a memory card inserted in card slot 1106 may provide a source for audio to be output at audio port 1102 and/or video data to be projected at 126. Card slot 1106 may receive any type of solid state memory device, including for example, Multimedia Memory Cards (MMCs), Memory Stick DUOs, secure digital (SD) memory cards, and Smart Media cards. The foregoing list is meant to be exemplary, and not exhaustive.

Although the present invention has been described in conjunction with certain embodiments, it is to be understood that modifications and variations may be resorted to without departing from the scope of the invention as those skilled in the art readily understand. Such modifications and variations are considered to be within the scope of the invention and the appended claims.

What is claimed is:

1. A microelectromechanical system (MEMS) device comprising:
    a fixed platform;
    a moving platform;
    a flexure coupling the moving platform to the fixed platform, the flexure being subject to stress when the moving platform moves relative to the fixed platform;
    a flexure conductor formed on the flexure to carry current between the fixed platform and the moving platform, the flexure conductor having at least three conductive layers and at least two insulating layers, wherein the at least three conductive layers are comprised of at least two different materials;
    a first conductor formed on the moving platform, wherein the first conductor is electrically coupled to the flexure conductor by a first underpass conductor formed on a substrate, wherein the first underpass conductor is at least partially underneath the first conductor and the flexure conductor; and
    a second conductor formed on the fixed platform, wherein the second conductor is electrically coupled to the flexure conductor by a second underpass conductor formed on the substrate, wherein the second underpass conductor is at least partially underneath the second conductor and the flexure conductor; and wherein the flexure conductor has a fatigue strength greater than either the first conductor or the second conductor.

2. The MEMS device of claim 1 wherein the at least three conductive layers and the at least two insulating layers alternate between each other.

3. The MEMS device of claim 1 wherein the at least three conductive layers include copper and nickel.

4. The MEMS device of claim 1 wherein the substrate is a silicon substrate.

5. The MEMS device of claim 1 wherein the moving platform includes a conductive coil electrically coupled to the conductor on the flexure.

6. The MEMS device of claim 5 wherein the coil is made of copper.

7. The MEMS device of claim 1 wherein the at least three conductive layers include copper.

8. The MEMS device of claim 1 wherein the at least two three conductive layers include nickel.

9. A mobile projection device comprising:
a fixed platform;
a moving platform;
a flexure coupling the moving platform to the fixed platform, the flexure being subject to stress when the moving platform moves relative to the fixed platform;
a flexure conductor formed on the flexure to carry current between the fixed platform and the moving platform, the flexure conductor having at least three conductive layers and at least two insulating layers, wherein the at least three conductive layers are comprised of at least two different materials;
a first conductor formed on the moving platform, wherein the first conductor is electrically coupled to the flexure conductor by a first underpass conductor formed on a substrate, wherein the first underpass conductor is at least partially underneath the first conductor and the flexure conductor; and
a second conductor formed on the fixed platform, wherein the second conductor is electrically coupled to the flexure conductor by a second underpass conductor formed on the substrate, wherein the second underpass conductor is at least partially underneath the second conductor and the flexure conductor; and wherein the flexure conductor has a fatigue strength greater than either the first conductor or the second conductor.

* * * * *